(12) United States Patent
Bohman et al.

(10) Patent No.: US 8,872,820 B2
(45) Date of Patent: Oct. 28, 2014

(54) SYSTEM AND METHOD FOR SPLITTING FACES ON A SOLID MODEL

(75) Inventors: Joseph J. Bohman, Cypress, CA (US); Victor Hambridge, Cypress, CA (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 1080 days.

(21) Appl. No.: 12/422,350

(22) Filed: Apr. 13, 2009

(65) Prior Publication Data

US 2009/0256842 A1 Oct. 15, 2009

Related U.S. Application Data

(60) Provisional application No. 61/044,644, filed on Apr. 14, 2008.

(51) Int. Cl.
 G06T 17/00 (2006.01)
 G06T 17/10 (2006.01)
 G06F 3/0481 (2013.01)
 G06T 19/20 (2011.01)
 G06F 17/50 (2006.01)
(52) U.S. Cl.
 CPC ............ *G06F 17/50* (2013.01); *G06T 17/10* (2013.01); *G06F 3/04815* (2013.01); *G06T 19/20* (2013.01)
 USPC ........................................................ 345/420
(58) Field of Classification Search
 CPC .......... G06F 17/50; G06T 17/10; G06T 19/20
 USPC ........................................................ 345/420
 See application file for complete search history.

(56) References Cited

U.S. PATENT DOCUMENTS 6,629,065 B1 * 9/2003 Gadh et al. ................... 703/1
7,042,451 B2 * 5/2006 Venkataraman et al. ..... 345/420
7,313,504 B2 * 12/2007 Chin et al. .................... 703/1

FOREIGN PATENT DOCUMENTS

CN 1869993 A 11/2006
(Continued)

OTHER PUBLICATIONS

Japenese Office Action dated Jan. 7, 2013 in connection with Japanese Patent Application No. 2011-505011, 6 pages.

(Continued)

*Primary Examiner* — Xiao Wu
*Assistant Examiner* — Charles Tseng

(57) ABSTRACT

A system, method, and computer program for selecting modifications to a solid model that is manipulated in a computer having software instructions, comprising a computer system, wherein the computer system includes a memory, a processor, a user input device, and a display device; a computer generated geometric model stored in the memory in the memory of the computer system; and wherein the computer system selects a selecting point on a modification feature directly on a solid model using a computer peripheral input; sorts by distance a plurality of adjacent faces that are adjacent to a selection face determined by the selecting point; determines whether a convex condition exists wherein the plurality of adjacent faces are convex to the selection face; determines whether a candidate curves exists where the plurality of adjacent faces share a same surface with a previously visited face and the convex condition exists; imprints the candidate curve on the solid model to prepare the solid model for modification according to a modification intent from a user; modifies the solid model according to the modification intent that results in a modified solid model and modified visual display information; and displays the modified solid model using the modified visual display information to the user, and appropriate means and computer-readable instructions.

10 Claims, 8 Drawing Sheets

(56) References Cited

FOREIGN PATENT DOCUMENTS

| | | |
|---|---|---|
| JP | 2001307111 | 11/2001 |
| JP | 2004234164 | 4/2004 |
| JP | 2006209763 A | 8/2006 |

OTHER PUBLICATIONS

Chinese Office Action dated Dec. 31, 2012 in connection with Chinese Patent Application No. 200980122294.2, 11 pages.

Chinese Grant Decision dated Jan. 10, 2014 for Chinese Application No. 200980122294.2, 9 pages.

* cited by examiner

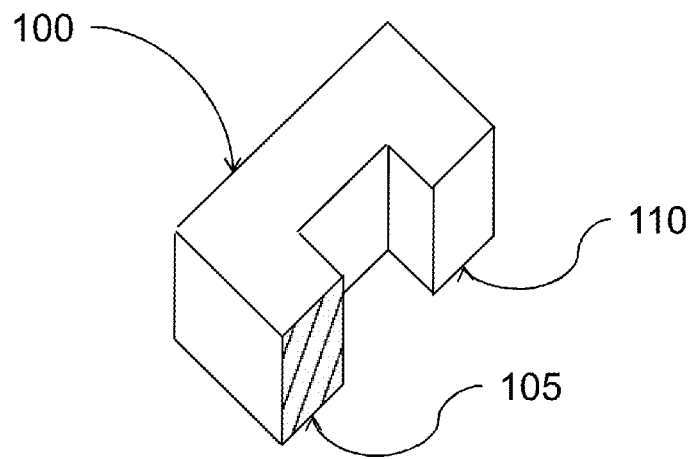
Fig. 1a
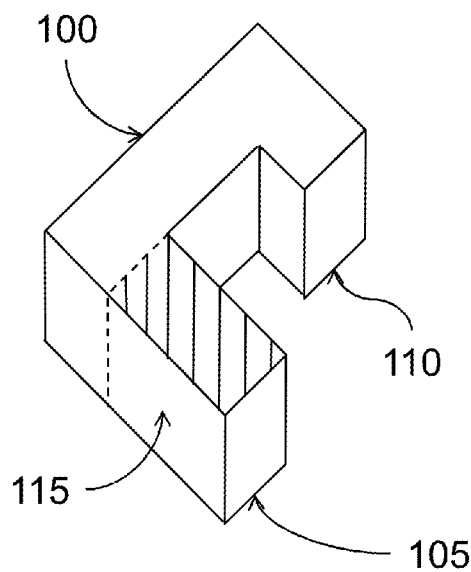
Fig. 1b
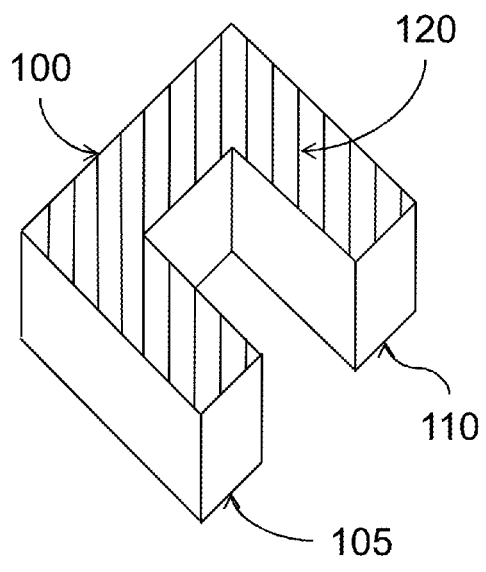
Fig. 1c
Figs. 1a-1c

SYSTEM AND METHOD FOR SPLITTING FACES ON A SOLID MODEL

CROSS-REFERENCE TO RELATED APPLICATIONS

This Application claims priority to Provisional U.S. Application Ser. No. 61/044,644, filed on Apr. 14, 2008.

TECHNICAL FIELD

The system of the innovations described herein relates generally to computer-aided design software applications. More specifically, the system relates to splitting faces in a solid model representation.

BACKGROUND

In today's world of computer-aided design (CAD) applications and geometry modeling systems, parts are commonly designed in one of two ways: history-based or history-less. A history-based system is commonly characterized by the parametric modeling paradigm that emerged in the mid-1980s. In parametric modeling systems, a recipe, or history tree, is created to reflect how things are related to one another. When a change is made to one original item, all items created later in time from the original item are updated. In this way, for example, two faces may remain coplanar, because they were designed with such a relationship captured during the design process and simply "replayed" during the update process. FIGS. 1a-1c illustrate a trimetric projection of a three-dimensional block. Referring to FIG. 1a, a C block 100 in three-dimension ("3D") is viewable to a user on a computer display and is in need of a modification by a user by altering a bottom leg 105, a top leg 110, or both the bottom leg 105 and the top leg 110. In a history-based system, how easily the user modifies the C block 100 depends upon how it was originally designed in the CAD application system, such as SolidEdge by Siemens Product Lifecycle Management Software Inc. Commonly, an original designer creates and/or designs a part that is later modified by a modify designer who maybe completely unfamiliar to the original designer. For example, if the original designer, i.e., the person that originally designed the C block 100, had the design method intent to constrain the faces related to the bottom leg 105 and the top leg 110 as coplanar, then the modification action illustrated in FIG. 1c is easy to accomplish using known parametric/history-based modeling techniques that are basic to one skilled in the art of 3D model design, but for simple explanation because the two faces are constrained to be coplanar, moving one face will cause the other face to move as well. If on the other hand, the modify designer intends to move only the face associated with the bottom leg 105 while leaving the top leg 110 alone, e.g., FIG. 1b, then several additional steps must transpire to remove the coplanar constraint requiring several additional steps that begins with understanding how the two legs of the C block 100 were created if the modify designer was not the original designer. Furthermore, if the original designer of the C block 100 did not model the bottom leg 105 and the top leg 110 to be coplanar but modeled the legs by some other method such as a distance or a formula, then to modify both as seen in FIG. 1c would increase the difficulty to a point where the modify designer may as well model the C block 100 from scratch.

On the other hand, modifying the C block 100 in a history-less or the body-based approach taken by companies like CoCreate, IronCAD, and Kubotek, for example, fails to maintain the history-tree made popular by the parametric modeling paradigm. In the history-less approach, changes are made explicitly for each item on a solid model. If the original designer of the C block 100 intended that the faces on the bottom leg 105 and the top leg 110 maintain a coplanar relationship, later modifications require the manual selection of the faces for edit to ensure the desired result, which is difficult if the original designer's intent is unknown or unascertainable. For example, the modify designer can make either change illustrated in FIG. 1b or FIG. 1c simply be selecting the one face or individually select all of the other coplanar faces, which happens to be a small number in this example but could be in the hundreds in a complex assembly model. Alternatively, some software applications could allow the modify designer to "make faces coplanar" and permanently capture the design intent after the fact at time of edit, but this can also be cumbersome particularly with very large models. This later alteration would make the modification see in FIG. 1b difficult at a later date particularly since now the design intent may be baked into the model contrary to design intent.

The issue with the history-based approach is that design intent is incorporated and fixed at the time of model creation, which can complicate making changes later-on that were not anticipated at the time of model creation. In contrast, the history-less systems are flexible about change at a later date, but capture very little intelligence about how things are related. If modify designers determine to manually capture such intelligence at a later point in time, then, like history-based systems, that intelligence is incorporated and fixed thereby limiting further flexibility.

That said, in the geometry modeling systems, geometry selection techniques involve setting options prior to selecting the geometry, i.e., the designers have to plan ahead to prepare for what they want to select. Planning ahead entails recommended preparatory actions and in many cases recommended error recovery when the selection does not satisfy the modification at hand. These recommended actions prove to overly labor intensive for history-less systems. In history-less system commands, selection options used to perform a modification are likely to change between command sessions, as well as within the command session. For example, with a move face command, the designer may move a boss, a rib, and a face connecting the boss and the rib in one command session. In another command session, the designer may move a single face or simply a slot. There is a technical challenge to identify under what conditions faces exist on a model that can serve to bound the merged rib where the merged rib is a rib that has a face that is flush with a non-rib face. It is known that a "rib" is a collection of faces that form a convex shape, and a "merged rib" 115 has the additional property that a rib face must be subdivided to isolate it from the remaining faces of the model. For example, if the modify designer intends to modify the merged rib 115 and intends to only select the merged rib 115 face the modify designer may have accidentally selected an entire face of the C block 100, indicated at 120.

The inventors have advantageously recognized a need for a system and method for splitting faces for modification, particularly those of the merged rib, in a solid model.

SUMMARY

To address the identified need and related problems, a system provides a system for selecting modifications to a solid model that is manipulated in a computer having software instructions, comprising a computer system, wherein the computer system includes a memory, a processor, a user input device, and a display device; a computer generated geometric model stored in the memory in the memory of the computer system; and wherein the computer system selects a selecting point on a modification feature directly on a solid model using a computer peripheral input; sorts by distance a plurality of adjacent faces that are adjacent to a selection face determined by the selecting point; determines whether a convex condition exists wherein the plurality of adjacent faces are convex to the selection face; determines whether a candidate curves exists where the plurality of adjacent faces share a same surface with a previously visited face and the convex condition exists; imprints the candidate curve on the solid model to prepare the solid model for modification according to a modification intent from a user; modifies the solid model according to the modification intent that results in a modified solid model and modified visual display information; and displays the modified solid model using the modified visual display information to the user.

Other features of the system are set forth in part in the description and in the drawings that follow, and, in part are learned by practice of the system. The system will now be described with reference made to the following Figures that form a part hereof. It is understood that other embodiments may be utilized and changes may be made without departing from the scope of the system.

BRIEF DESCRIPTION OF THE DRAWINGS

A system will hereinafter be described in conjunction with the appended drawings, wherein like designations denote like elements, and:

FIGS. 1a-1c illustrate a trimetric projection of a three-dimensional block;

DETAILED DESCRIPTION OF THE PREFERRED EMBODIMENTS

1. Introduction

A method and system for modifying geometric relationships in a solid model are described. In the following description, for the purposes of explanation, numerous specific details are set forth in order to provide a thorough understanding of the system. It will be apparent, however, to one skilled in the art that the system may be practiced without these specific details. In other instances, well-known structures and devices are shown in block diagram form in order to avoid unnecessarily obscuring the system.

Figure 2:
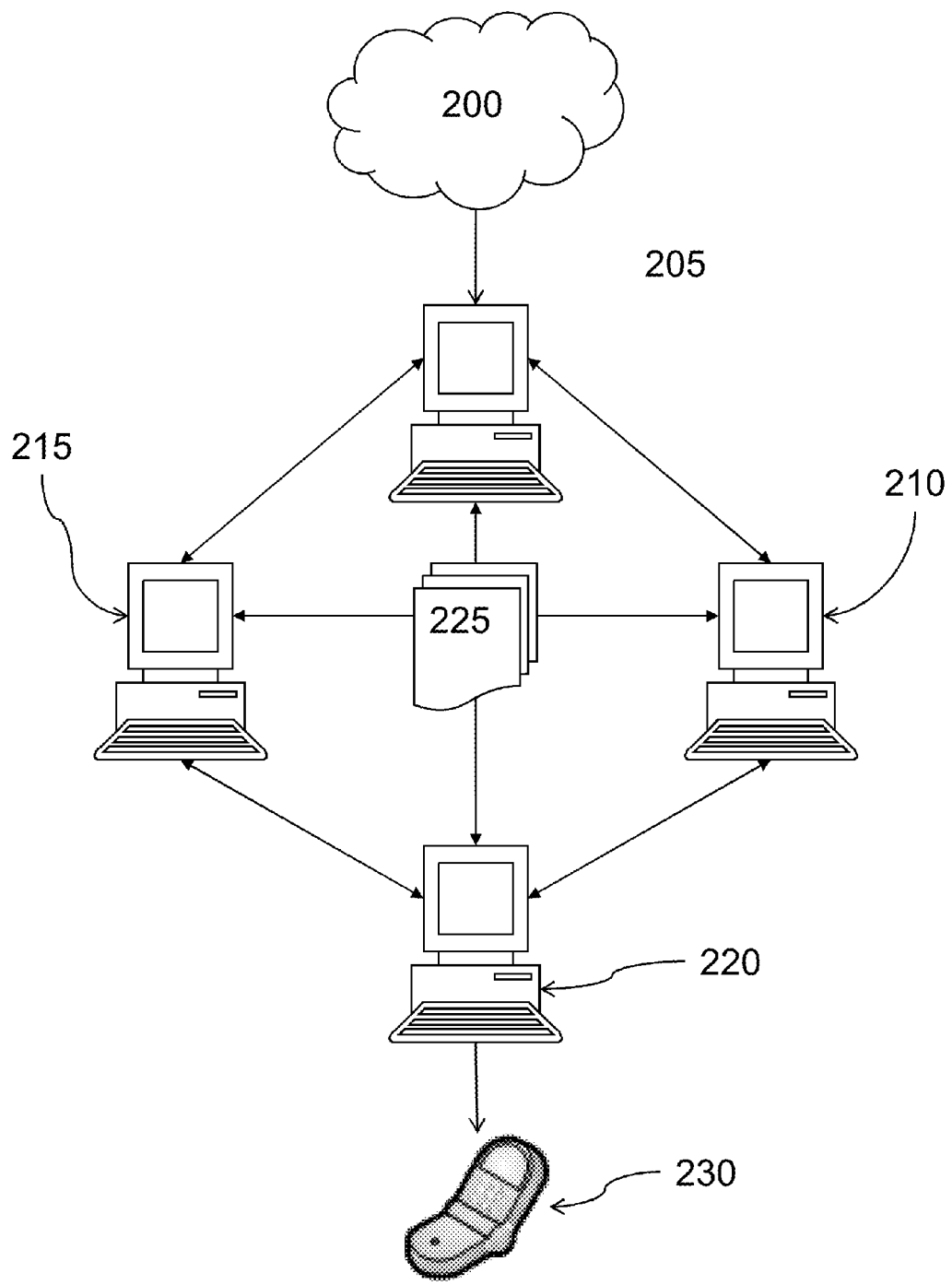
FIG. 2 illustrates a sample virtual product development environment.

FIG. 2 illustrates a sample virtual product development environment. The virtual development environment employed today typically begins with a customer request, or an innate desire, to create or improve upon a product, generally shown at 200. That product can be as simple as a bottle opener or as complex as a submarine. Referring further to FIG. 2, an original designer models a desired product according to known methods employed by a computer-aided design (CAD) application 205, The CAD application 205 is executed on a general computing machine which subsequently becomes a specific purpose computing environment for the sake of executing computer-aided design routines at the time of application execution and interaction, the details of which are discussed below. The CAD application 205 is preferably SolidEdge or NX both offered for license by Siemens Product Lifecycle Management Software Inc. A CAD user operates the CAD application 205 in a well known and understood manner so as to virtually display a solid model that resembles and conforms to an original design requirement ascertained from the customer request or the innate desire. The solid model is commonly an assembly of components and assemblies, where the assemblies are further broken down into sub-assemblies and/or components, all preferably having a virtual representation stored for subsequent recall in solid model data files 225.

Once the solid model is determined to be in a suitable form comporting to the original design requirements, it is preferably tested using a computer-aided engineering (CAE) application 210 such as NX CAE or FEMAP offered by Siemens Product Lifecycle Management Software Inc by a CAE user for part fault-tolerance tests and a variety of other engineering tests. If the CAE user determines that the solid model has to be modified to successfully pass the fault-tolerance tests the solid model is returned to the CAD user for modification in the CAD application 205. This iteration between the CAD application 205 and the CAE application 210 and the respective users is recursive until the solid model successfully passes necessary design requirements and engineering test.

Following successful completion, the solid model in its final design form is further designed for physical manufacture in a computer-aided manufacturing (CAM) application 215 such as NX CAM or CAM Express both offered by Siemens Product Lifecycle Management Software Inc. By using the CAM application 215, a CAM user will model how numerical control programs, molds, tools and dies manufacture a physical product 230. The CAM user may have additional modifications to comport to the original design requirements, for example, using electro-discharge machining (EDM) may require different techniques depending if a wire-cut EDM or die-sinking EDM is used to manufacture the physical product 230. To virtually mill a part, the CAM application 215 defines the preferably electrode path of the orbit for the EDM process. The CAM user may determine that in order to comport to design and engineering requirements, the solid model requires a subtle modification in dimensions, for example following a cool-down to allow for hardening of the material comprising the physical product 230.

Following the successful virtual designing, engineering, and manufacturing of the product, a manufacturer can link all manufacturing disciplines with product engineering related to the product including: process layout and design, process simulation/engineering, and production management utilizing a digital factory application 220 such as Tecnomatix offered by Siemens Product Lifecycle Management Software Inc. The manufacturer may find the need to modify the physical product 230 because the CAM users modeled the product with, for example, an EDM system that is outdated and requires the manufacturer to use a 5-axis turning machine to create the necessary blank or the manufacturer has shifted to injection molding rather than compression molding to form the parts that comprise the physical product 230. For example, the solid model has to be modified to comport to the final requirements to manufacture the physical product 230.

Throughout the virtual product development described above, the product design flowed for example from the customer request to the CAD user to the CAE user to the CAD user, back to the CAE user, to the CAM user, and then to the Manufacturer for physical production of the physical product 230. With each edit to the solid model, geometric relationships are also modified so as to comport to the necessary design changes by the CAD user, the CAE user, the CAM user, and the Manufacturer, for example. Further as each of the CAD/CAE/CAM users modify the solid model, a data model that defines the solid model is also modified to properly account for the changes discussed above and properly stored in the solid model data files 225. The manufacturer then proceeds to produce the physical product 230 according to the original design specifications and subsequent engineering modifications. The virtual product development occurs in a system, where the system and method for modifying geometric relationships in a solid model is executable in a variety of software applications resident in memory on a variety of hardware systems, described in more detail below.

2. Computer Program Product

Figure 3:
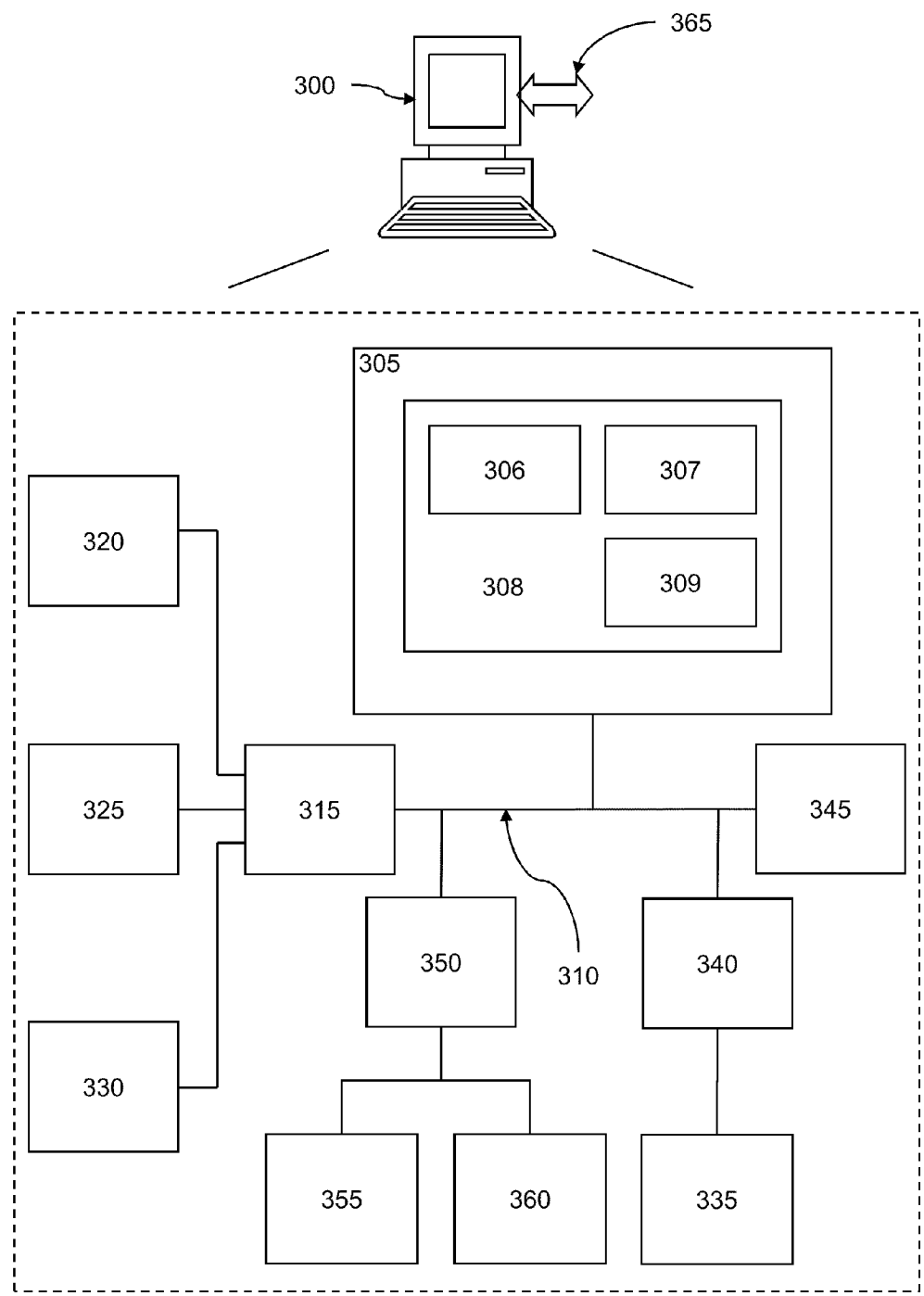
FIG. 3 is a block diagram of a computer environment in which the system may be practiced.

Turning now to a hardware system, FIG. 3 is a block diagram of a computer system in which the system may be practiced. FIG. 3 and the following discussion are intended to provide a brief, general description of a suitable hardware system and computing environment in which the embodiment may be implemented. The embodiment may be performed in any of a variety of known computing environments.

Referring to FIG. 3, an exemplary computer system includes a computing device in the form of a computer 300, such as a desktop or laptop computer, which includes a plurality of related peripheral devices (not depicted). The computer 300 includes a central processing unit (CPU) 305 and a bus 310 employed to connect and enable communication between the central processing unit 305 and a plurality of components of the computer 300 in accordance with known techniques. The operation of the CPU 305 is well understood in the art that is preferably an electric circuit that can execute computer programs having computer-executable instructions encoded thereon, such as program modules, which are executed by the computer 300. Generally, program modules include routines, programs, objects, components, data structures, etc., that perform particular tasks or implementation particular data types. Preferably the program modules include a file processing module 306, a data display module 307, a logic processing module 308, and a method processing module 309. The logic processing module 308 sends requests to the file processing module 306, the data display module 307 and the method processing module 309 to operate according to the computer-executable instructions. Likewise the logic processing module receives requests from the file processing module 306, the data display module 307 and the method processing module 309 to operate according to the computer-executable instructions. The bus 310 also enables communication among the various program modules and the plurality of components. The bus 310 may be any of several types of bus structures including a memory bus or memory controller, a peripheral bus, and a local bus using any of a variety of bus architectures. The computer 300 typically includes a user interface adapter 315, which connects the central processing unit 305 via the bus 310 to one or more interface devices, such as a keyboard 320, mouse 325, and/or other interface devices 330, which can be any user interface device, such as a touch sensitive screen, digitized pen entry pad, etc. The bus 310 also connects a display device 335, such as an LCD screen or monitor, to the central processing unit 305 via a display adapter 340. The bus 310 also connects the central processing unit 305 to a memory 345, which can include ROM, RAM, etc.

The computer 300 further includes a drive interface 350 that couples at least one storage device 355 and/or at least one optical drive 360 to the bus. The storage device 355 can include a hard disk drive, not shown, for reading and writing to a disk, a magnetic disk drive, not shown, for reading from or writing to a removable magnetic disk drive. Likewise the optical drive 360 can include an optical disk drive, not shown, for reading from or writing to a removable optical disk such as a CD ROM or other optical media. The aforementioned drives and associated computer-readable media provide non-volatile storage of computer readable instructions, data structures, program modules, and other data for the computer 300 that is accessible by the file processing module 306 according to instructions received by the logic processing module 308 in the method described by instructions provided by the method processing module 309.

The computer 300 can communicate via a communications channel 365 with other computers or networks of computers. The computer 300 may be associated with such other computers in a local area network (LAN) or a wide area network (WAN), or it can be a client in a client/server arrangement with another computer, etc. Furthermore, the embodiment may also be practiced in distributed computing environments where task instructions provided by the logic processing module 308 in the method described by instructions provided by the method processing module 309 and are performed by remote processing devices that are linked through a communications network. In a distributed computing environment, the program modules may be located in both local and remote memory storage devices. All of these configurations, as well as the appropriate communications hardware and software, are known in the art.

Figure 4A:
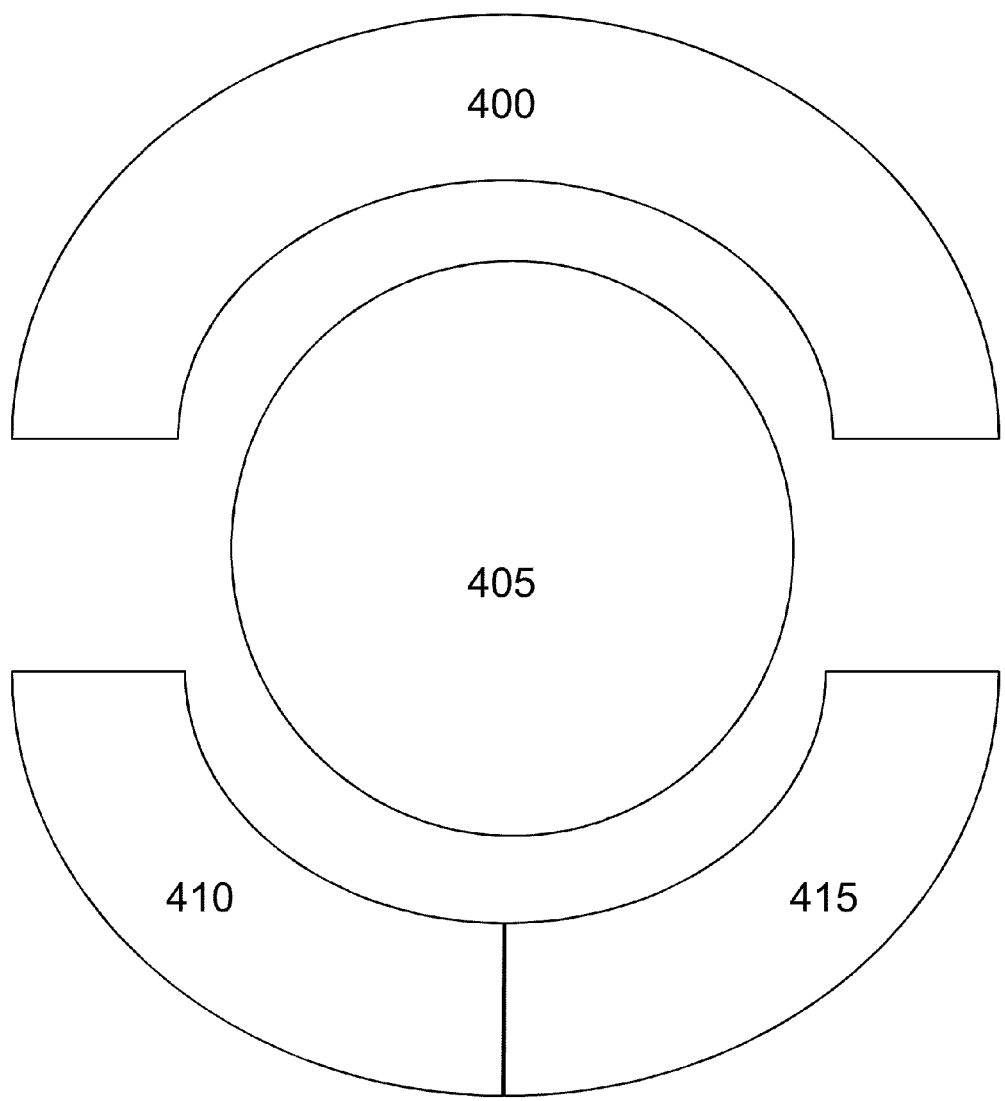
FIGS. 4a-4b illustrate a general concept of a software programming code embodied in a software application
Figure 4B:
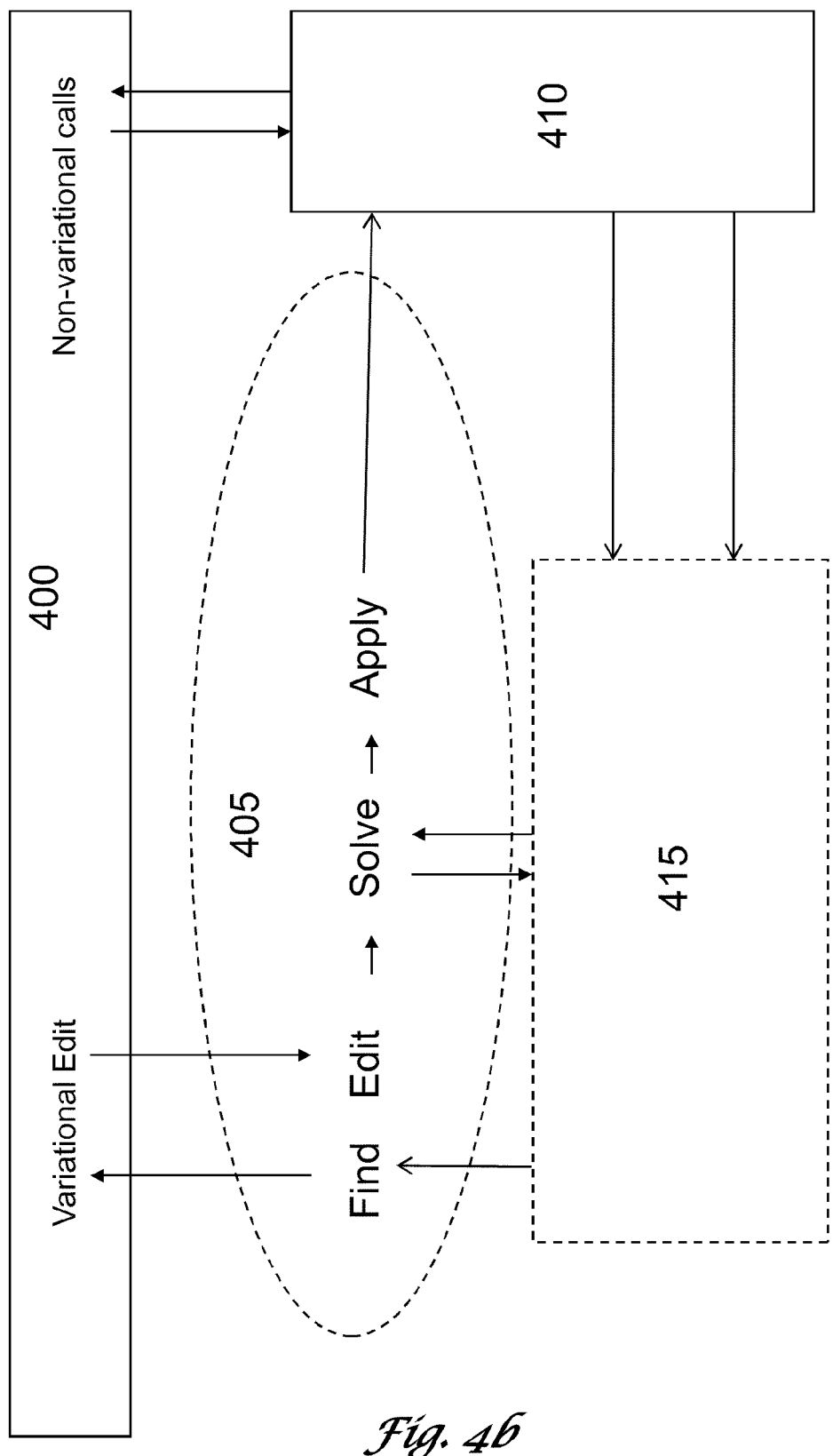

Turning now to the program modules in more detail, FIGS. 4a-4b illustrate a general concept of a software programming code embodied in a software application. Referring further to FIG. 4a, the program modules will be described in more detail below in the context of the embodiment where a software application 400 contains accessible program modules as those discussed above. The software application 400 may be in the form of a solid modeling application such as the aforementioned CAD application 205, the CAE application 210 or CAM application 215. Further it is contemplated that the software application 400 is provided by a third party vendor with particular API ("application programming interface") call features for access and utilization. Continuing, as the user interacts with the software application 400, certain modification events trigger interaction with a variational modeling toolkit 405, to be discussed in greater detail below. The software application 400 and the variational modeling toolkit 405 together or individually utilize the logic processing module 308 in the method described by instructions provided by the method processing module 309 to call a low-level geometric modeling kernel to accomplish the certain modification events of the solid model according to the commands selected by the user and executed by the software application 400, as generally understood in the art of solid modeling, but also discussed in more detail below. The low-level geometric modeling kernel is commonly a collection of at least a three-dimensional (3D) geometric modeler 410 like Parasolid licensed by Siemens Product Lifecycle Management Software Inc and a collection of geometric software component libraries 415 like the 3D DCM (or "DCM") product offered by Siemens Product Lifecycle Management Software Inc.

Put another way, referring to FIG. 4b, the variational modeling toolkit 405 operates on variational edit commands communicated from the software application 400. Additionally, the software application 400 communicates non-variational modeling calls to the 3D geometric modeler 410, and the 3D geometric modeler 410 utilizes the collection of geometric software component libraries 415 as normally understood in the art of geometric modelers. With regard to the variational modeling toolkit 405, and to be discussed in greater detail below, several operations occur related to the variational edit that involve find, edit, solve and apply. It is commonly understood in the art of solid modeling that the collection of geometric software component libraries above provides modeling functionality such as geometric constraint solving, variational design, parametric design, motion simulation, collision detection, clearance computations, topology location, topology move solution, and hidden line removal, for example. It is also contemplated to be within the scope of this embodiment that the 3D geometric modeler 410 and the component libraries 415 are components of the same application rather than separate components, or combinations thereof. Having described the computer program product, more detail is now provided with regard to a splitting system.

3. Splitting System

Figure 5:
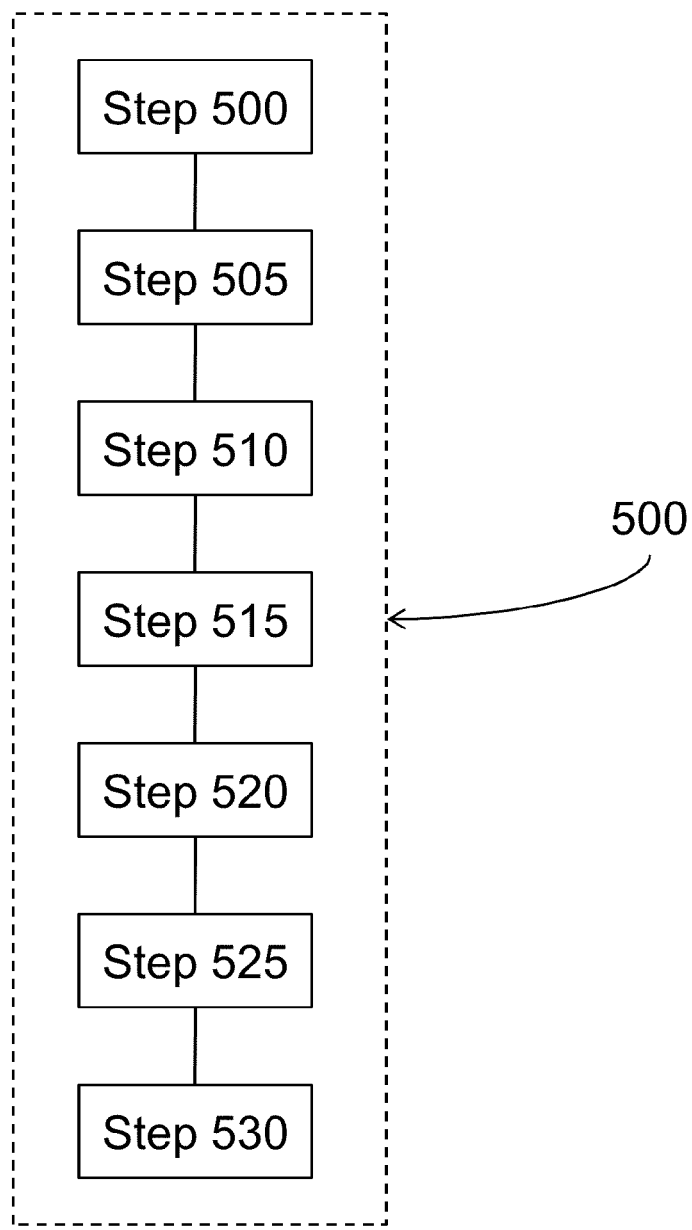
FIG. 5 is a box diagram of a general view of a method employed by the embodiment.

Turning now to the face splitting system, FIG. 5 is a box diagram of a general view of a method employed by the embodiment. Referring to FIG. 5, the embodiment discloses the logic processing module 308 using the method described by instructions provided by the method processing module 309, where the described method is a method for splitting faces in a solid model that is manipulated in a computer having software instructions for design, generally depicted at 500. The following steps are mentioned to provide an overview of the embodiment described in the system having details that are subsequently discussed. The system selects a selecting point on a modification feature directly on a solid model using a computer peripheral input (Step 500). The system sorts by distance a plurality of adjacent faces that are adjacent to a selection face determined by the selecting point (Step 505). The system determines whether a convex condition exists wherein the plurality of adjacent faces are convex to the selection face (Step 510). The system determines whether a candidate curves exists where the plurality of adjacent faces share a same surface with a previously visited face and the convex condition exists (Step 515). The system imprints the candidate curve on the solid model to prepare the solid model for modification according to a modification intent from a user (Step 520). The system modifies the solid model according to the modification intent that results in a modified solid model and modified visual display information (Step 525). The system displays the modified solid model using the modified visual display information to the user (Step 530).

Figure 6:
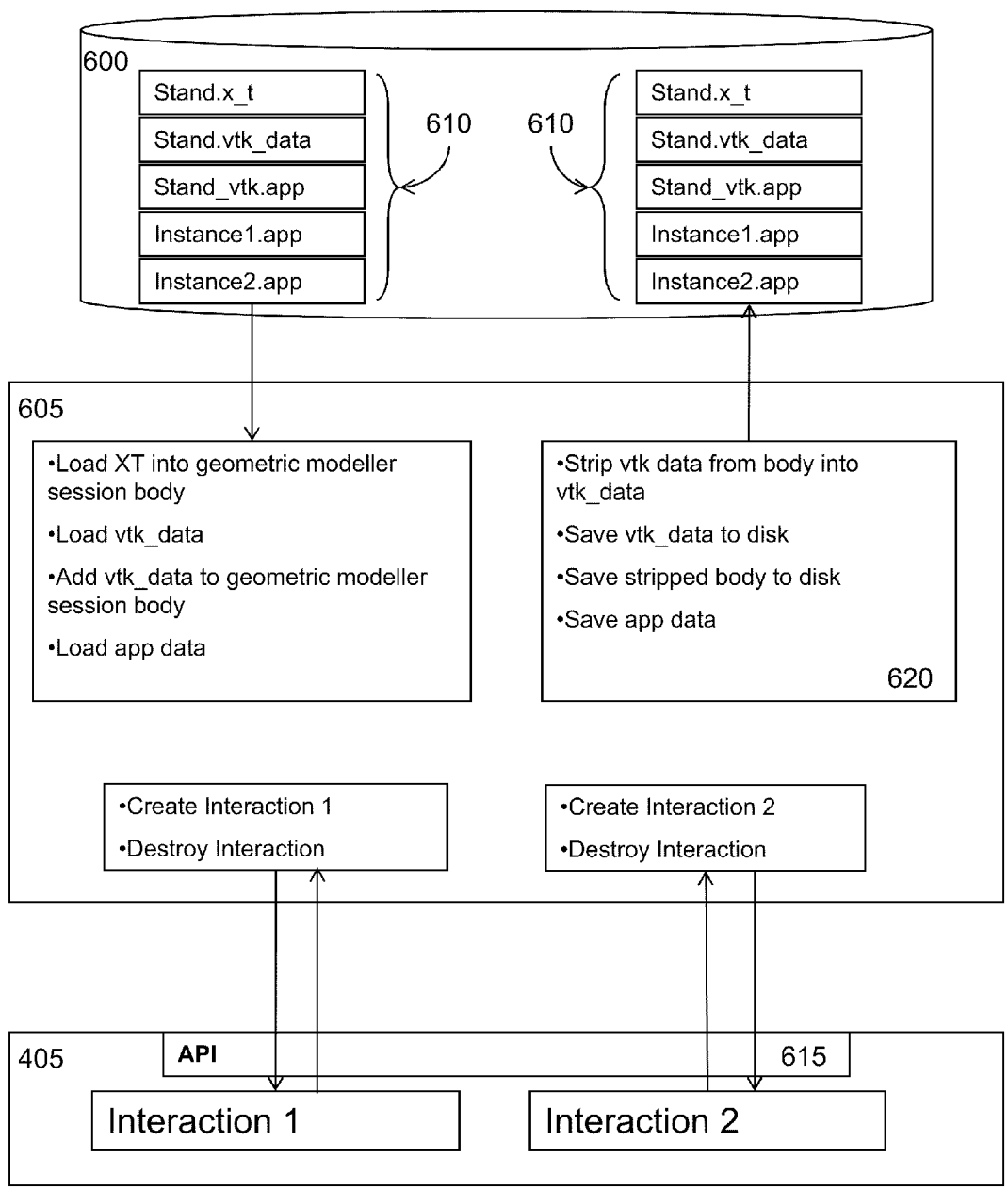
FIG. 6 illustrates an exemplary solid model modification system.

FIG. 6 illustrates an exemplary solid model modification system. The user using the software application 400 executes the necessary commands for the software application 400 to access the storage device 355 that is preferably a hard disk drive 600 having data related to a virtual representation of a solid model stored in the solid model data files 425 that are preferably accessible by the software application 400, the variational modeling toolkit 405, the 3D geometric modeler 410 and the component libraries 415. Referring further to FIG. 6, the software application 400 is characterized by a solid modeling application 605 that accesses the solid model data files 425 structured preferably as data files 610 stored on the hard disk drive 600 in preferably a stand.x_t format that refers to a modeler transmit file type for the 3D geometric modeler 410, a stand.vtk_data format that refers to a variational modeling toolkit information file type for the variational modeling toolkit 405, where stand* refers to a generic part file name. The solid modeling application 605 has its own recognized file type extensions, for example APP, which it uses to obtain sufficient information for manipulation of the solid model. Continuing, the solid modeling application 605 loads the stand.x_t file into a 3D geometric modeler session body to be accessed by the 3D geometric modeler 410. The stand.vtk_data file is loaded and added to the 3D geometric modeler session body. The solid modeling application 605 loads the application data relating to the solid model and accesses the data files 610 according to its own file type, for example PRT. The designer of the loaded solid model intends to modify some aspect of the viewed solid model. In so intending, the designer selects a topology that can be a face, edge, or vertex, to modify. By selecting the topology to modify, the solid modeling application begins interactions with the variational modeling toolkit 405 to handle the modification computations by way of the variational modeling toolkit API 615 using techniques known in the art. Following the solid model modification, in order to save the modified solid model to the hard disk drive 600, block 620 illustrates the data related to the variational modeling toolkit 405 is striped from the solid model and placed into a vtk_data structure that is then saved to the stand.vtk_data file. The stripped solid body is also saved to the hard disk drive 600, as is the application data. The act of selecting topology, for example a merged rib is discussed in more detail below.

4. Splitting Method

Turning now to the face splitting system in greater detail, the system includes a face splitting method that employs multiple passes through a recursive procedure, which has as input a single face and a selection point. A set C is maintained to store parametric data of all new edges added to the model following the selection of the merged rib. The method also maintains a set of faces that are excluded from processing, F(e), where the list is initially empty. The current state of the solid model is saved in S. The method receives the designer's input in the form of a single face and the selection point. The adjacent faces to the single face are obtained and sorted by distance. The sorted and obtained adjacent faces are examined in a recursive manner to determine rib qualification and potential to limit the rib by splitting. For rib qualification, the adjacent face must be convex with respect to the inputted single face. For potential limit to the rib two determinations are made. First, if the adjacent face shares the same underlying surface as a previously visited face and second, if any two of the faces has a peripheral loop that borders on a face previously identified as a rib, the method attempts to split the face. Further, if an edge is added, the recursion is halted and another pass is made using the initial inputs, where these faces are excluded from any further processing. This second determination effectively reduces the scope of the faces visited on all subsequent passes, for example, the same face may be split more than once thus multiple passes are possible. The parameters for all created edges are saved in the set C. On exhausting the set of adjacent faces, the faces that satisfy the rib qualification, supra, are visited recursively until there are no more faces to visit. Now the parametric data of those edges that do not bound the inputted single face are discarded from the set C. The solid model is returned to the saved state S, and the edges saved in the set C are imprinted into the solid model.

5. Splitting Illustration

Figure 7A:
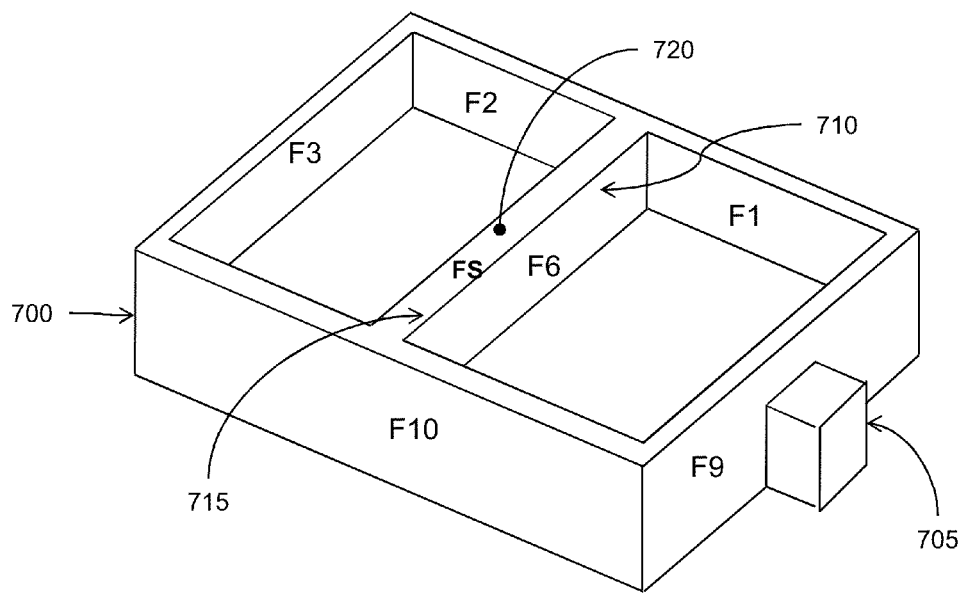
FIGS. 7a-7b illustrate an exemplary face splitting method in a solid model modification system.
Figure 7B:
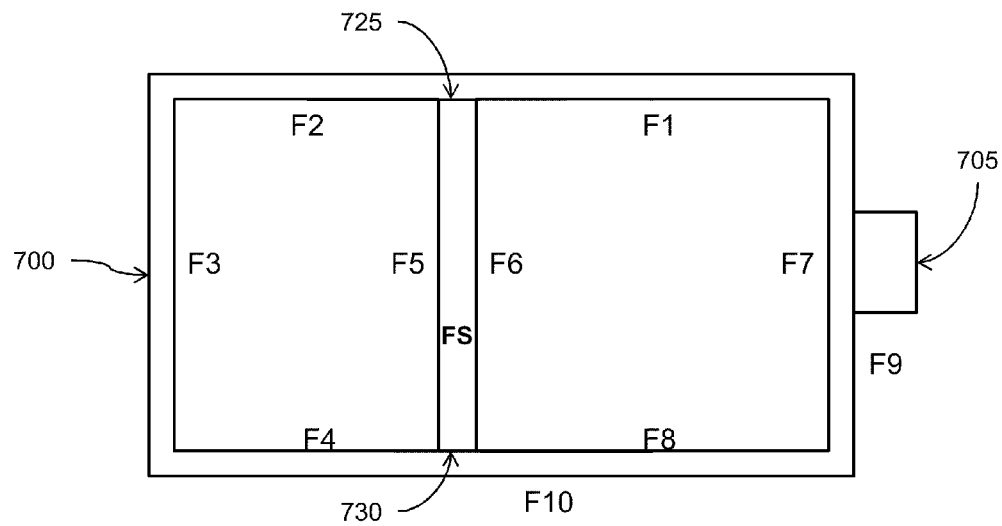

FIGS. 7a-7b illustrate an exemplary face splitting in a solid model modification system. Referrings to FIGS. 7a & 7b, the designer has loaded for visual display a solid model 700 for modification. The solid model 700 has a rib 705 and a merged rib 710. The designer intends to modify the merged rib 710 and determines a selection face 715 and a selection point 720. The system lets FS be the selected face at point PT. F1 and F2 share the same underlying surface and are both adjacent to FS and thus a curve on this surface can be used to split the face FS. At initialization, the system sets F(e) and C equal to the empty set, { }. The current model state is saved as S. In this example 3 passes occur. At pass 1,

```
Set the visited face set F(v) = { } and the qualifying Rib face set
F(r) ={ }
Procedure P ( Face FS, Point PT)
{
    Add FS to F(r) ;
    A = {F5, F6, F1,F2, F4, F8, . . . }
    F(t) = { }
    For all F in A:
    {
        F5:  does not share a surface with a face in F(v) ; F5 is not
             in F(e) and F5 is convex with respect to FS so add to
             F(t) and F(v)
        F6:  does not share a surface with a face in F(v) ; F6 is not
             in F(e) and F6 is convex with respect to FS so add to F(t)
             and F(v)
        F1:  does not share a surface with a face in F(v) ; F1 is not
             in F(e) and F1 is convex with respect to FS so add to F(t)
             and F(v )
        F2:  shares the same surface as F1 in F(v) so we attempt to
             split the rib.
             The peripheral loops of F2 and F1 have a common face in
             FS in F(r).
             Add F1 and F2 to F(e).
             Determine the curve to be imprinted.
             Imprint, add all new edge parameter data to C and Halt P.
    }
}
```

At pass 2, F(e)={F1, F2}; C={C1}, where C1 is generally shown at 725:

```
Set F(v) = { }, F(r) ={ }
Procedure P ( face FS, Point PT)
{
    Add FS to F(r) ;
    A = {F5, F6, F1,F2, F4, F8, . . . }
    F(t) = { }
    For all F in A:
    {
        F5:  does not share a surface with a face in F(v) ; F5 is not
             in F(e) and F5 is convex with respect to FS so add to F(t)
             and F(v)
        F6:  does not share a surface with a face in F(v) ; F6 is not
             in F(e) and F6 is convex with respect to FS so add to F(t)
             and F(v)
        F1:  is excluded
        F2:  is excluded
        F4:  does not share a surface with a face in F(v) ; F4 is not
             in F(e) and F4 is convex with respect to FS so add to F(t)
             and F(v)
```

-continued
```
        F8:  shares the same surface as F1 in F(v) so attempt to split
             the rib. peripheral loops of F4 and F8 have a common face
             of FS in F(r)
             Add F4 and F8 to F(e).
             Determine the curve to be imprinted.
             Imprint , add all new edge parameter data to C and Halt P.
    }
}
```

At pass 3, F(e)={F1, F2, F4, F8}; C={C1, C2}, where C2 is generally shown at 730:

```
Set F(v) = { }, F(r) ={ }
Procedure P ( Face FS, Point PT)
{
    Add FS to F(r) ;
    A= {F5, F6, F1,F2, F4, F8, . . . }
    F(t) = { }
    For all F in A:
    {
        F5:  does not share a surface with a face in F(v) ; F5 is not
             in F(e) and F5 is convex with respect to FS so add to F(t)
             and F(v)
        F6:  does not share a surface with a face in F(v) ; F6 is not
             in F(e) and F6 is convex with respect to FS so add to F(t)
             and F(v)
        F1:  is excluded
        F2:  is excluded
        F4:  is excluded
        F8:  is excluded
        For All in F(t) enter P.
    }
}
```

It is evident from the above that adjacent faces F5 and F6 will not add to the rib, and so the recursion ends with the rib defined and isolated. Now return to the model state S, and imprint the curves C1 and C2 as part of the solid model 800.

6. Conclusion

The embodiment may be implemented in digital electronic circuitry, or in computer hardware, firmware, software, or in combinations thereof. An apparatus of the embodiment may be implemented in a computer program product tangibly embodied in a machine-readable storage device for execution by a programmable processor; and method steps of the embodiment may be performed by a programmable processor executing a program of instructions to perform functions of the embodiment by operating on input data and generating output.

The embodiment may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language.

Generally, a processor will receive instructions and data from a read-only memory and/or a random access memory. Storage devices suitable for tangibly embodying computer program instructions and data include numerous forms of nonvolatile memory, including by way of example semiconductor memory devices, such as EPROM, EEPROM, and flash memory devices; magnetic disks such as internal hard disks and removable disks; magneto-optical disks; and CD- ROM disks. Any of the foregoing may be supplemented by, or incorporated in, specially-designed ASICs (application2-specific integrated circuits).

A number of embodiments have been described. It will be understood that various modifications may be made without departing from the spirit and scope of the embodiment. It is anticipated that the disclosed active selection system will work as well with conditions such as coplanar, coaxial, etc., as it does with features. Therefore, other implementations are within the scope of the following claims.

What is claimed is:

1. A system for selecting modifications to a solid model that is manipulated in a computer having software instructions, comprising:
    a computer system, wherein the computer system includes a memory, a processor, a user input device, and a display device;
    a computer generated geometric model stored in the memory of the computer system; and
    wherein the computer system
        selects a selecting point on a modification feature directly on a solid model using a computer peripheral input;
        sorts by distance a plurality of adjacent faces that are adjacent to a selection face determined by the selecting point;
        maintains a set of faces of the solid model that are excluded from processing;
        determines whether a convex condition exists wherein the plurality of adjacent faces are convex to the selection face;
        determines whether a candidate curve exists where the plurality of adjacent faces share a same surface with a previously visited face and the convex condition exists;
        imprints the candidate curve on the solid model to prepare the solid model for modification according to a modification intent from a user and adds, to the set of faces of the solid model that are excluded from processing, the adjacent faces that share the same surface with a previously visited face and the convex condition exists;
        modifies the solid model according to the modification intent that results in a modified solid model and modified visual display information; and
        displays the modified solid model using the modified visual display information to the user.

2. The system of claim 1, wherein the computer system loads a solid model data file having visual display data into a solid model modeling application.

3. The system of claim 2, wherein the computer system computes the modified solid model into the solid model data file.

4. A method for splitting faces in a solid model, comprising:
    selecting by receiving a selecting point on a modification feature directly on a solid model via a computer peripheral input;
    sorting by distance a plurality of adjacent faces that are adjacent to a selection face determined by the selecting point;
    maintaining a set of faces of the solid model that are excluded from processing;
    determining whether a convex condition exists wherein the plurality of adjacent faces are convex to the selection face;
    determining whether a candidate curve exists where the plurality of adjacent faces share a same surface with a previously visited face and the convex condition exists;
    imprinting the candidate curve on the solid model to prepare the solid model for modification according to a modification intent from a user and adding, to the set of faces of the solid model that are excluded from processing, the adjacent faces that share the same surface with a previously visited face and the convex condition exists;
    modifying the solid model according to the modification intent that results in a modified solid model and modified visual display information; and
    displaying the modified solid model using the modified visual display information to the user.

5. The method of claim 4, further comprising loading a solid model data file having visual display data into a solid model modeling application.

6. The method of claim 5, further comprising computing the modified solid model into the solid model data file.

7. A computer program product, comprising a non-transitory computer usable medium having a computer readable program code embodied therein, the computer readable program code, when executed, causing a computer to perform the actions of:
    providing a system, wherein the system comprises a logic processing module, a display processing module, and a method processing module;
    selecting a selecting point on a modification feature directly on a solid model using a computer peripheral input, and wherein the selecting is performed by a method processing module in response to being called by the logic processing module;
    sorting by distance a plurality of adjacent faces that are adjacent to a selection face determined by the selecting point, and wherein the sorting is performed by a method processing module in response to being called by the logic processing module;
    maintaining a set of faces of the solid model that are excluded from processing;
    determining whether a convex condition exists wherein the plurality of adjacent faces are convex to the selection face, and wherein the determining is performed by a method processing module in response to being called by the logic processing module;
    determining whether a candidate curve exists where the plurality of adjacent faces share a same surface with a previously visited face and the convex condition exists, and wherein the determining is performed by a method processing module in response to being called by the logic processing module;
    imprinting the candidate curve on the solid model to prepare the solid model for modification according to a modification intent from a user, and wherein the imprinting is performed by a method processing module in response to being called by the logic processing module, and adding, to the set of faces of the solid model that are excluded from processing, the adjacent faces that share the same surface with a previously visited face and the convex condition exists;
    modifying the solid model according to the modification intent that results in a modified solid model and modified visual display information, and wherein the modifying is performed by a method processing module in response to being called by the logic processing module; and displaying the modified solid model, by the display processing module and to the user, using the modified visual display information from the method processing module.

8. The computer program product of claim 7, further comprising providing the system with a data file processing module.

9. The computer program product of claim 8, further comprising loading the solid model data file having visual display data into the solid model modeling application, and wherein said loading is performed by a data file processing module in response to being called by a logic processing module.

10. The computer program product of claim 8, further comprising computing the modified solid model into the solid model data file by data file processing module in response to being called by a logic processing module.

* * * * *